(12) United States Patent
Roy et al.

(10) Patent No.: US 8,906,728 B2
(45) Date of Patent: Dec. 9, 2014

(54) METHOD FOR MANUFACTURING A PHOTODETECTOR HAVING A BANDWIDTH TUNED HONEYCOMB CELL PHOTODIODE STRUCTURE

(71) Applicants: Applied Micro Circuits Corporation, San Diego, CA (US); Volex PLC, London (GB)

(72) Inventors: Subhash Roy, Lexington, MA (US); Igor Zhovnirovsky, Newton, MA (US); Sergey Vinogradov, Moscow (RU)

(73) Assignees: Applied Micro Circuits Corporation, San Diego, CA (US); Volex PLC, London (GB)

( * ) Notice: Subject to any disclaimer, the term of this patent is extended or adjusted under 35 U.S.C. 154(b) by 0 days.

(21) Appl. No.: 14/171,339

(22) Filed: Feb. 3, 2014

(65) Prior Publication Data

US 2014/0147945 A1    May 29, 2014

Related U.S. Application Data

(60) Division of application No. 13/355,615, filed on Jan. 23, 2012, now Pat. No. 8,680,639, which is a continuation-in-part of application No. 13/278,953, filed on Oct. 21, 2011.

(51) Int. Cl.
*H01L 21/00* (2006.01)
*G01J 1/44* (2006.01)
*H01L 31/00* (2006.01)
*H01L 21/66* (2006.01)
*H01L 31/02* (2006.01)

(52) U.S. Cl.
CPC . *G01J 1/44* (2013.01); *H01L 31/00* (2013.01); *H01L 22/14* (2013.01); *H01L 31/02019* (2013.01)

USPC ............... 438/48; 438/17; 438/65; 257/290; 257/292; 257/E27.133

(58) Field of Classification Search
USPC ............... 438/17, 48, 65; 257/440, 290, 292, 257/E27.133
See application file for complete search history.

(56) References Cited

U.S. PATENT DOCUMENTS 4,791,396 A * 12/1988 Nishizawa et al. ............ 257/258
5,039,490 A *  8/1991 Marsoner et al. ............ 422/82.01

(Continued)

OTHER PUBLICATIONS

U.S. Appl. No. 13/278,953, filed Oct. 21, 2011, Vinogradov.

(Continued)

*Primary Examiner* — Andy Huynh
(74) *Attorney, Agent, or Firm* — Baker & Hostetler LLP

(57) ABSTRACT

A photodetector with a bandwidth-tuned cell structure is provided. The photodetector is fabricated from a semiconductor substrate that is heavily doped with a first dopant. A plurality of adjoining cavities is formed in the semiconductor substrate having shared cell walls. A semiconductor well is formed in each cavity, moderately doped with a second dopant opposite in polarity to the first dopant. A layer of oxide is grown overlying the semiconductor wells and an annealing process is performed. Then, metal pillars are formed that extend into each semiconductor well having a central axis aligned with an optical path. A first electrode is connected to the metal pillar of each cell, and a second electrode connected to the semiconductor substrate. The capacitance between the first and second electrodes decreases in response to forming an increased number of semiconductor wells with a reduced diameter, and forming metal pillars with a reduced diameter.

7 Claims, 17 Drawing Sheets

(56) References Cited

U.S. PATENT DOCUMENTS

| | | |
|---|---|---|
| 6,177,289 B1 | 1/2001 | Crow et al. |
| 6,891,243 B2 * | 5/2005 | Adachi et al. ............ 257/443 |
| 7,127,133 B2 | 10/2006 | Manderscheid |
| 7,902,540 B2 | 3/2011 | Cohen |
| 8,680,639 B1 | 3/2014 | Roy et al. |
| 2004/0007754 A1 * | 1/2004 | Adachi et al. ............ 257/443 |
| 2004/0089790 A1 * | 5/2004 | Rubin et al. ............ 250/214.1 |
| 2006/0042677 A1 | 3/2006 | Fukunaga et al. |
| 2009/0289320 A1 * | 11/2009 | Cohen ............ 257/458 |
| 2011/0248315 A1 * | 10/2011 | Nam et al. ............ 257/184 |

OTHER PUBLICATIONS

U.S. Appl. No. 14/171,455, filed Feb. 3, 2014, Roy et al.

* cited by examiner

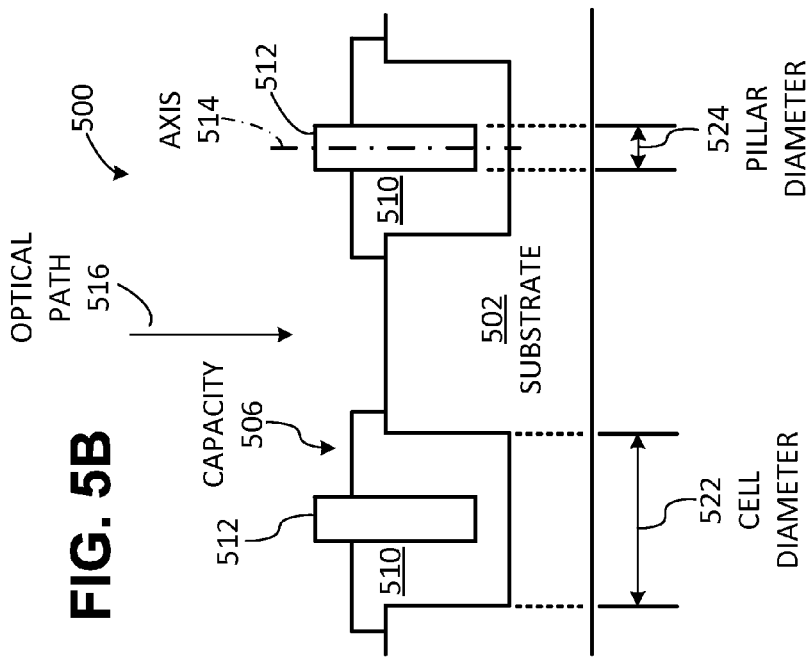
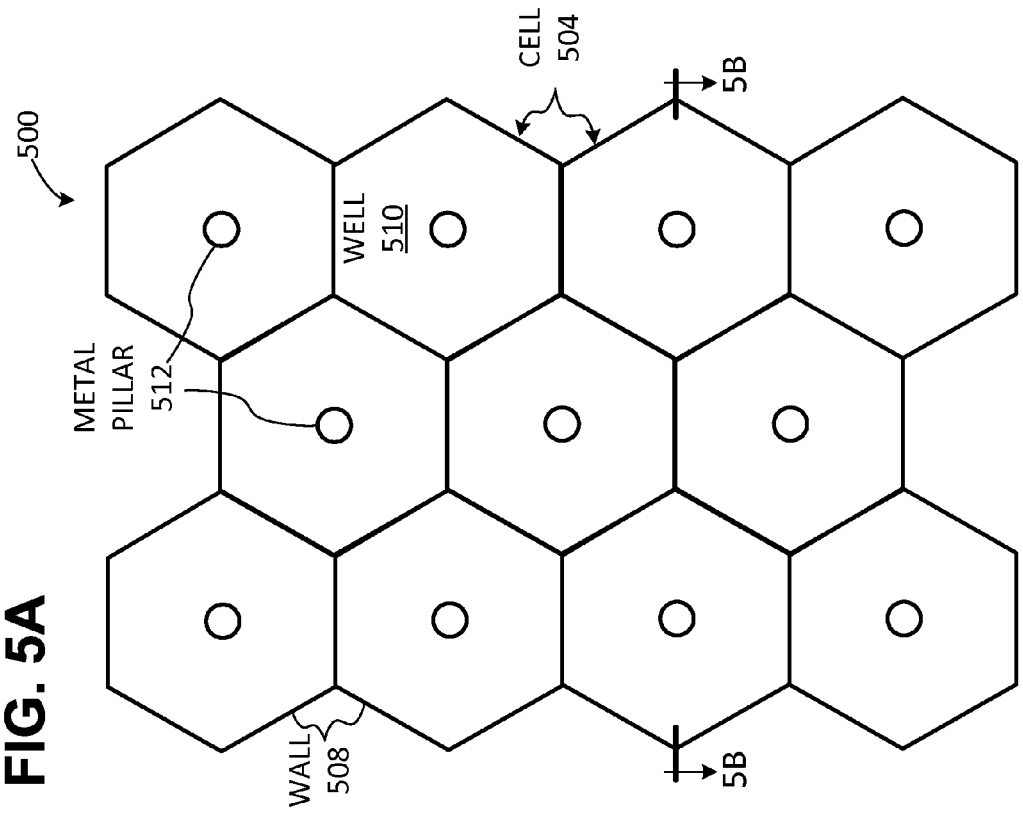

FIG. 7A1
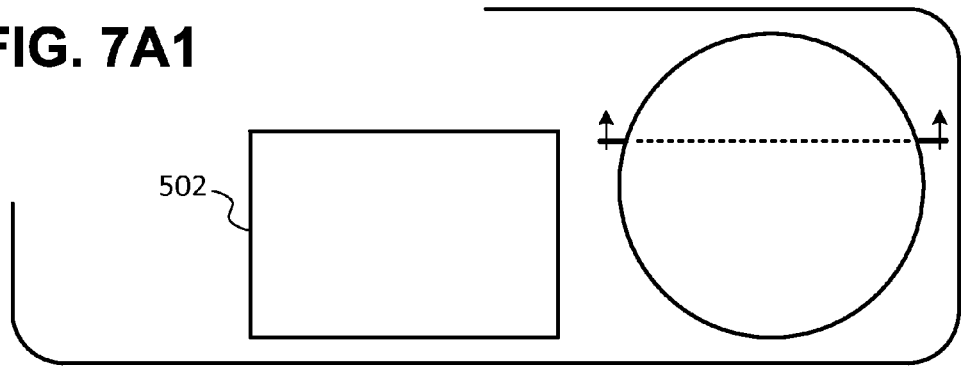
FIG. 7A2
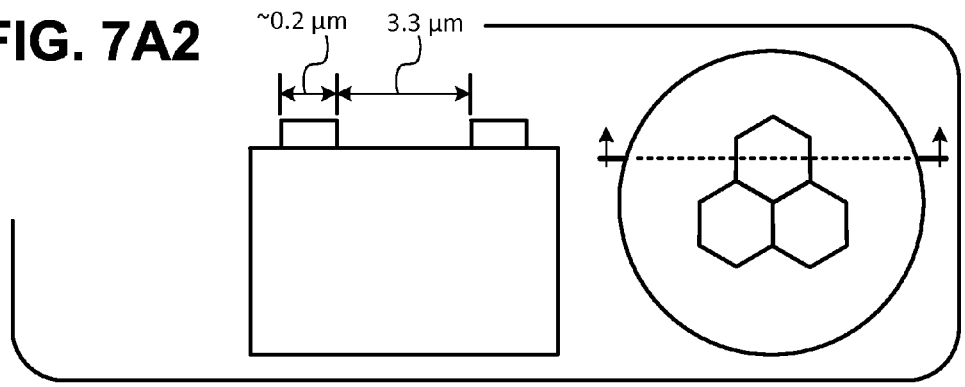
FIG. 7A3
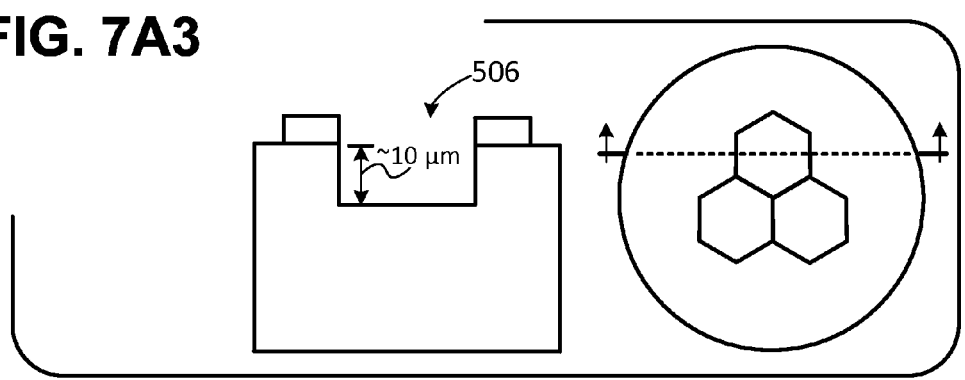

FIG. 7A4
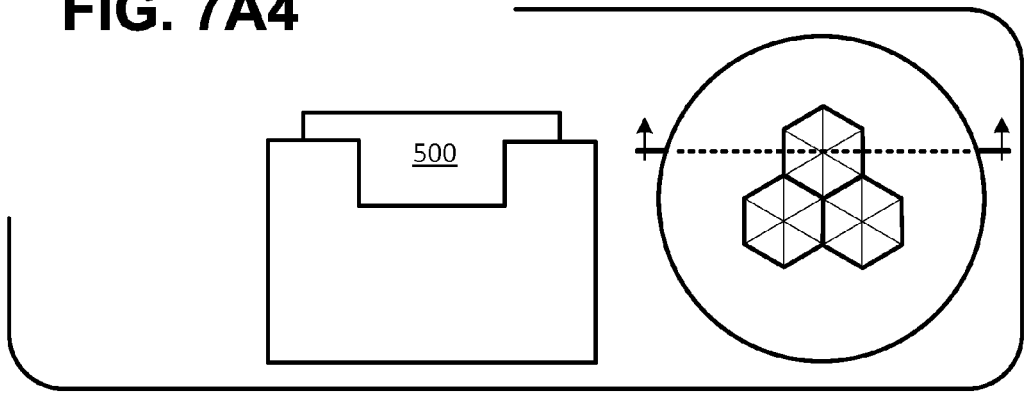
FIG. 7A5
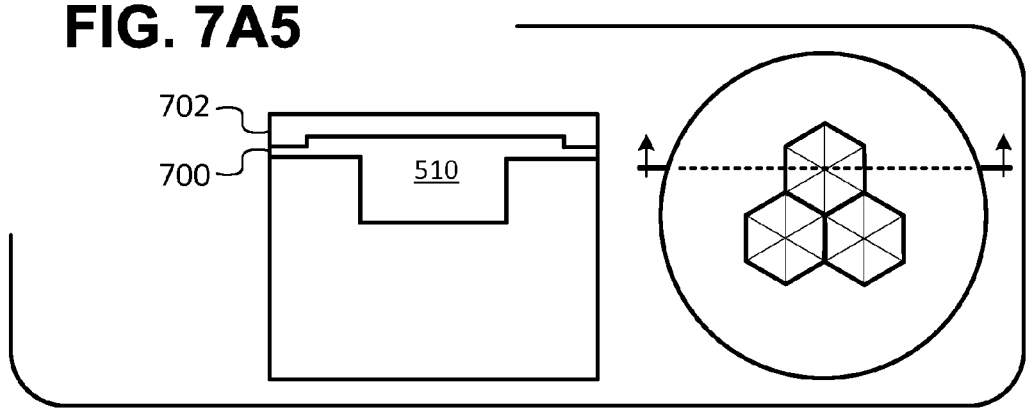
FIG. 7B5
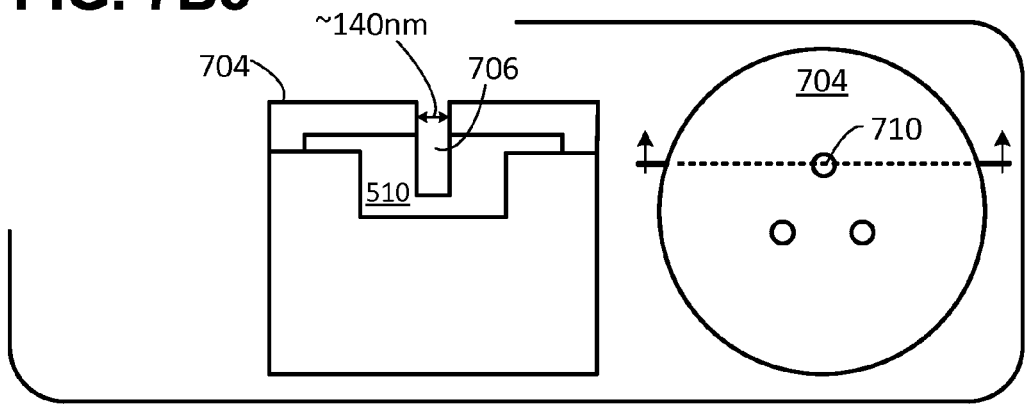

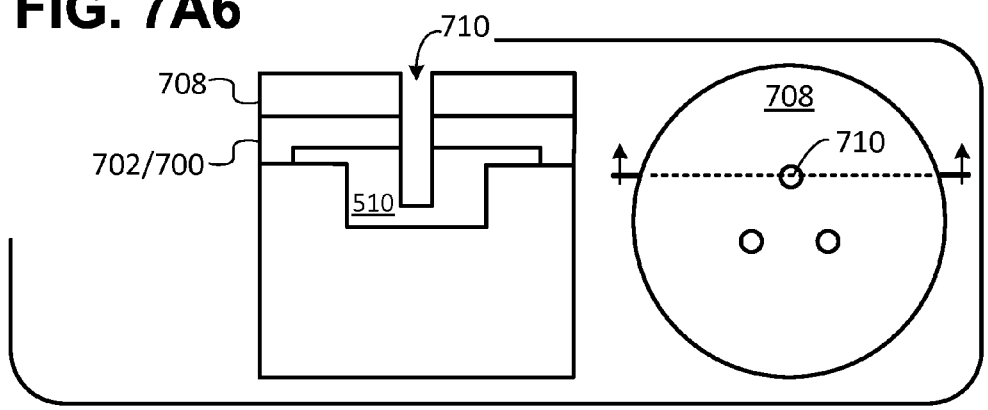
FIG. 7A6
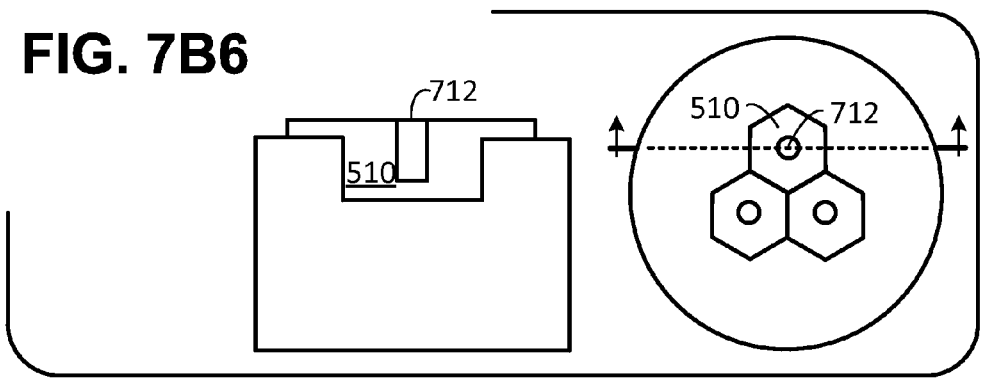
FIG. 7B6
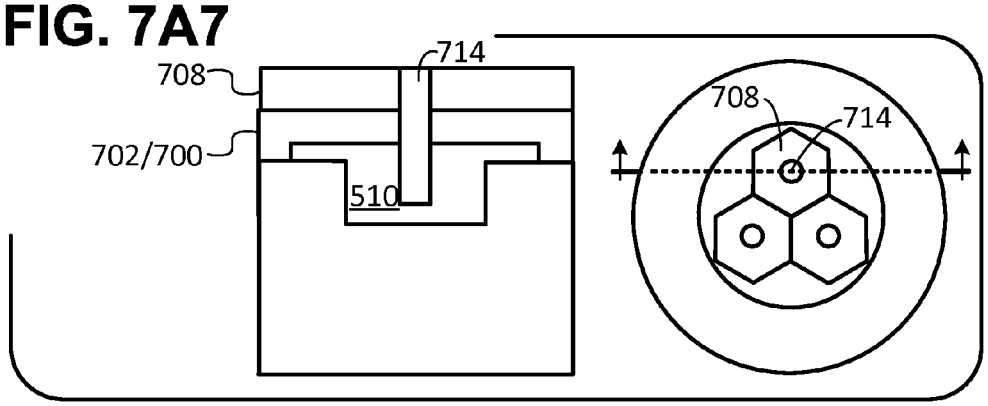
FIG. 7A7

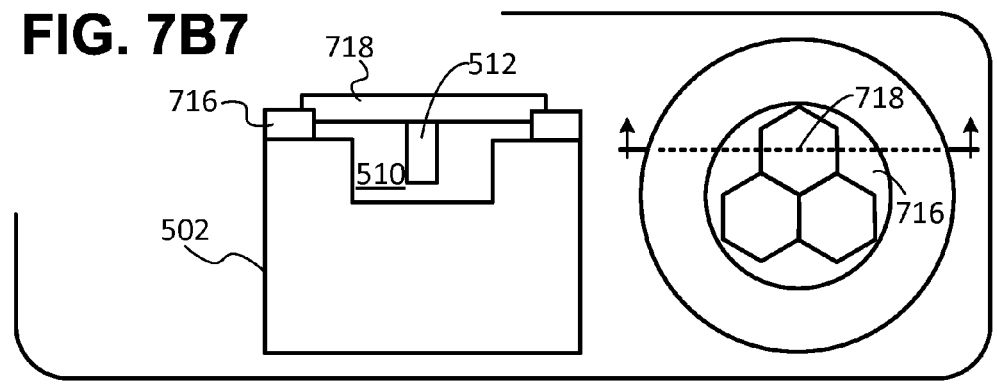
FIG. 7B7
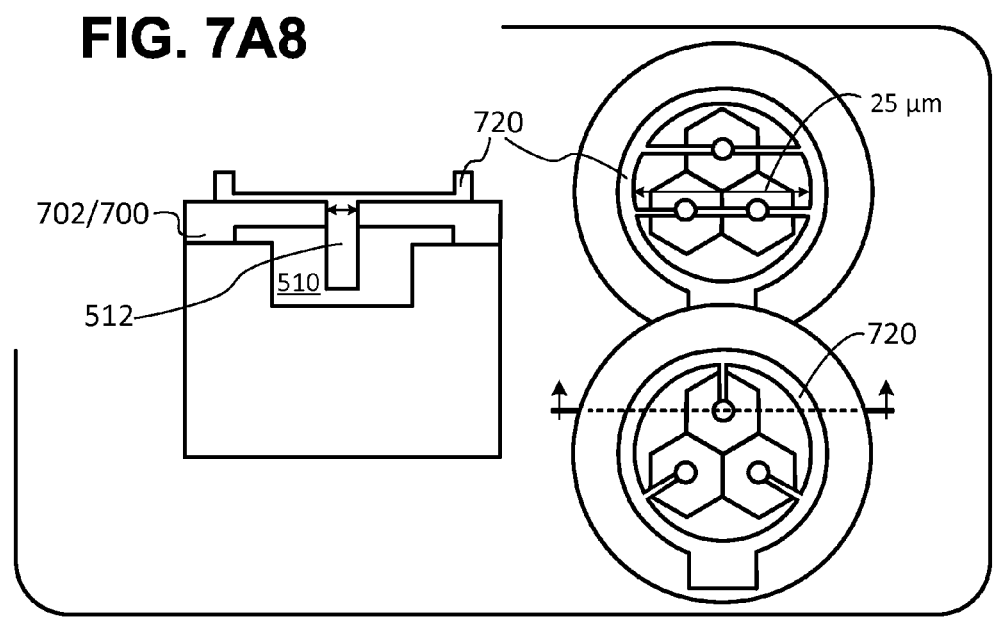
FIG. 7A8

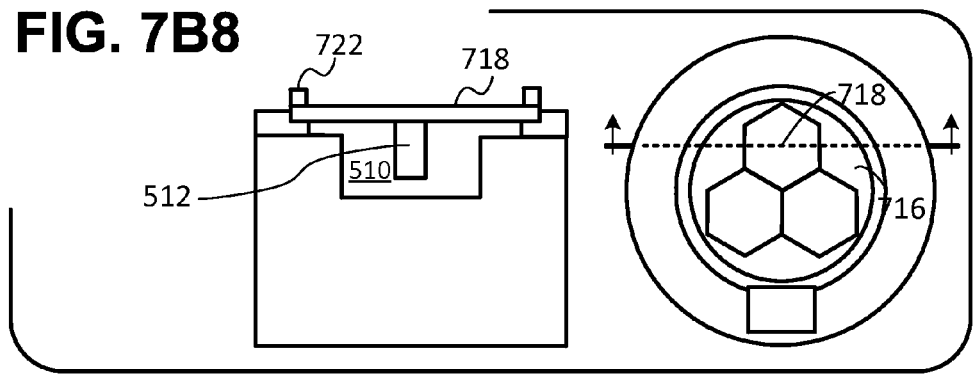
FIG. 7B8
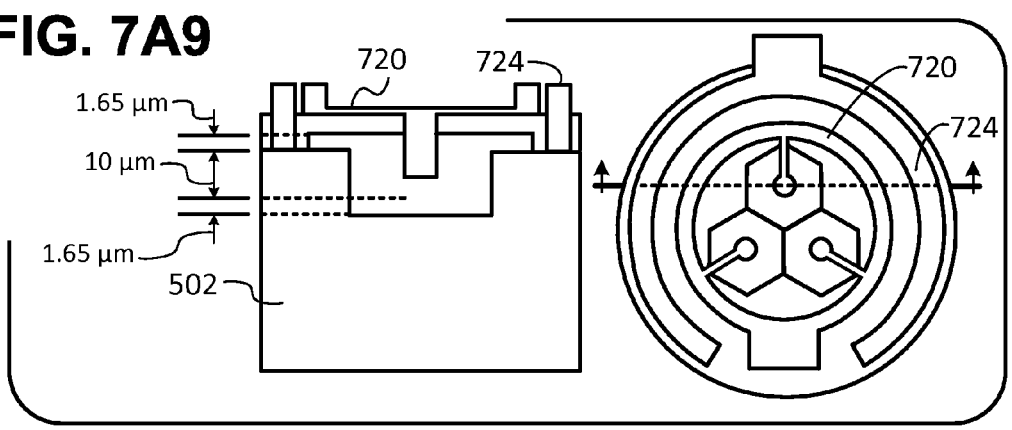
FIG. 7A9
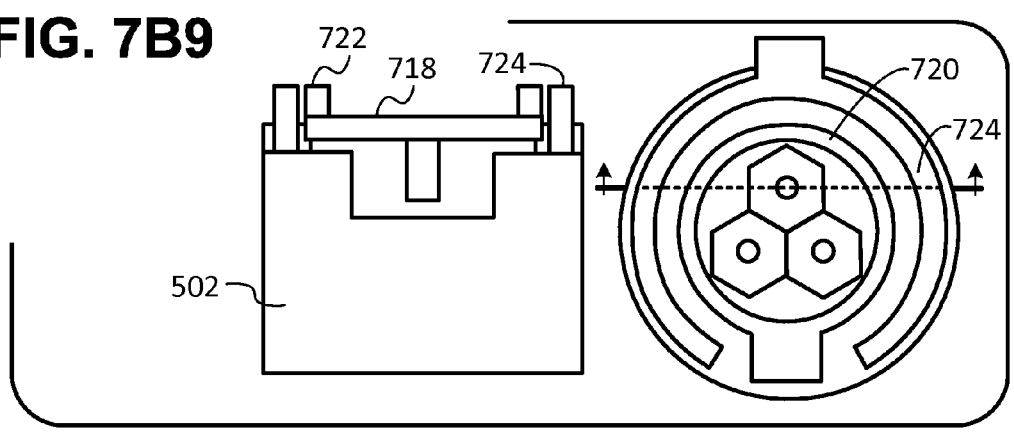
FIG. 7B9

FIG. 7A10
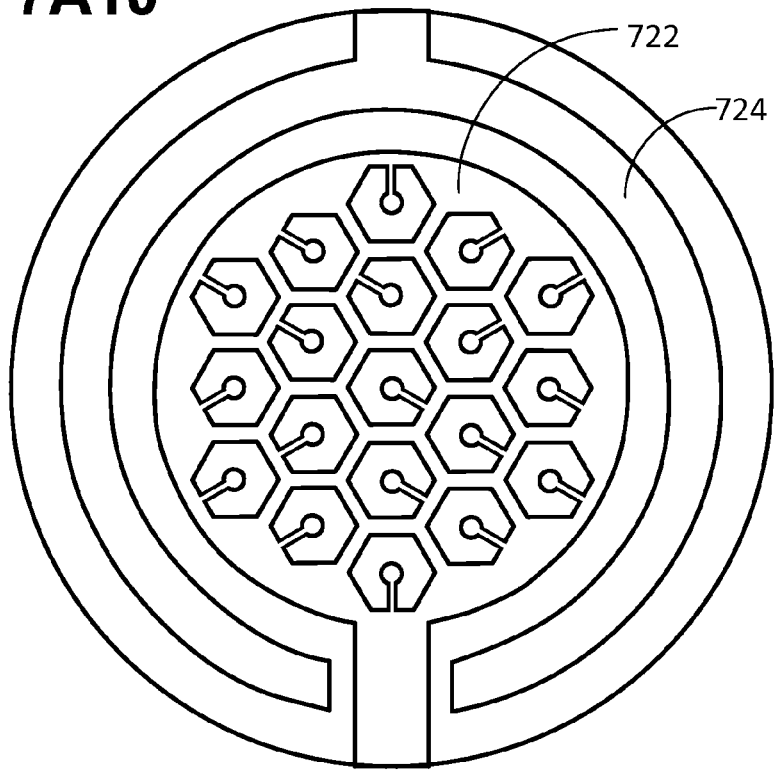
FIG. 8
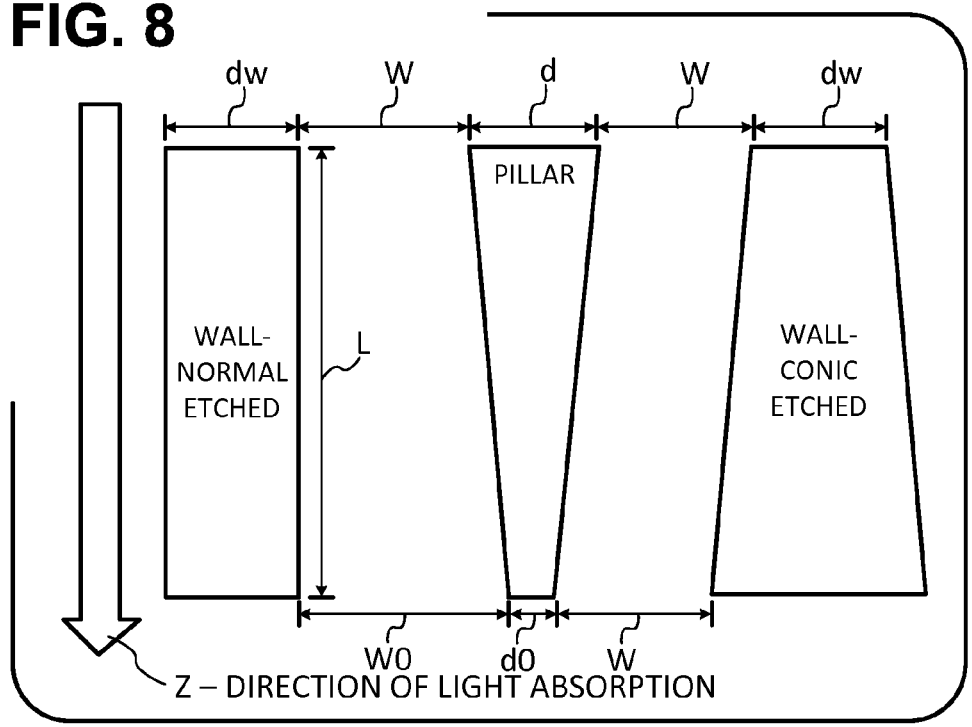

| LAYERS | Ncell | W OPTIMAL, μm | BW max, GHz | QE@BWmax | AREA DIAM, μm (APPROX) |
|---|---|---|---|---|---|
| 1 | 1 | | | | |
| 2 | 7 | | | | |
| 3 | 19 | 0.85 | 28 | 15% | ~20 |
| 4 | 37 | 1.25 | 18 | 20% | ~30 |
| 5 | 61 | 1.75 | 13 | 25% | ~50 |
| 6 | 91 | 2.25 | 10 | 28% | ~70 |
| 7 | 127 | 2.9 | 7.5 | 30% | ~100 |
| 8 | 169 | | | | |

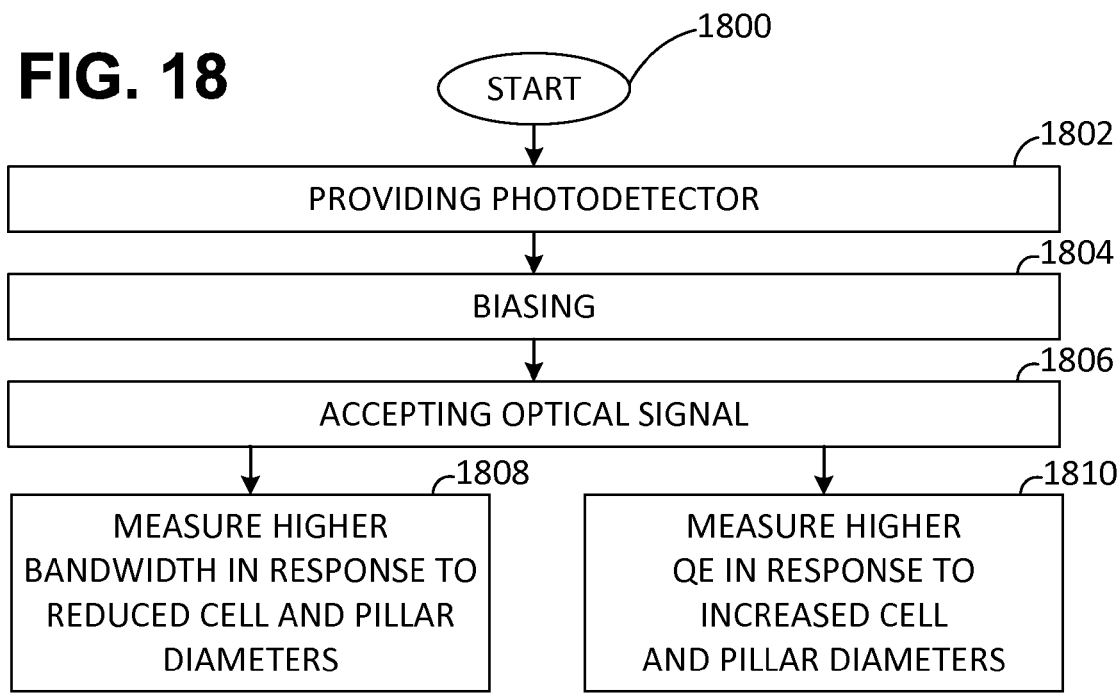

METHOD FOR MANUFACTURING A PHOTODETECTOR HAVING A BANDWIDTH TUNED HONEYCOMB CELL PHOTODIODE STRUCTURE

CROSS REFERENCE TO RELATED APPLICATIONS

This application is a divisional of U.S. patent application Ser. No. 13/355,615, filed on Jan. 23, 2012, which is a continuation-in-part of U.S. patent application Ser. No. 13/278,953, filed Oct. 21, 2011, the contents of each of which are incorporated herein by reference in their entirety

TECHNICAL FIELD

This invention generally relates to solid state photodetectors and, more particularly, to a cell structure of photodiodes made using a vertical pillar aligned with the path of light.

BACKGROUND

The most widely used semiconductor devices for light detection are PN or PIN photodiodes. To enable the fastest electrical output signal time response (highest bandwidth) using a photodiode of a particular area, it is necessary to set an optimal thickness of active layer to balance transit time and RC time contributions to the bandwidth (BW). The optimal thickness of active layer with respect to BW is insufficient for the detection of light, as the absorption length in a thick active layer results in low quantum efficiency (QE) of photodetection at longer wavelengths. It is for this reason that silicon PN and PIN photodiodes are typically too inefficient for high-speed optical communications at wavelengths of 850 nanometers (nm) or greater.

FIG. 1 is a diagram depicting a metal-semiconductor-metal (MSM) photodetector (prior art). The MSM photodiode uses the rectifying properties of Schottky contacts between metal and semiconductor materials in a manner similar to PN junctions. The trade-off between transit time and RC time contributions is partially resolved in MSM photodetectors due to the low capacitance of the interdigital electrodes, as compared to the capacitance of PIN photodiodes having the same active area and active layer thickness. Nevertheless, the thickness of the active layer in an MSM device cannot be made too great due to inefficient and slow collection of photoelectrons and holes generated at depths larger than the spacing between fingers. Capacitance can be decreased, and BW increased if the metal electrodes are moved closer together. However, this results in greater shading of the absorption (active) layer. Thus, MSM photodetectors typically use a very thin active layer if high BWs are required, resulting in low QE for wavelengths with an absorption depth longer than the active layer thickness. Materials such Si, Ge, SiC, GaAs, InGaAs, and InP are typically used as the active absorptive layer.

FIG. 2 is a partial cross-sectional view of lateral trench detector (prior art). Improvement in the QE of a MSM photodetector using a relatively thick absorption/active layer can be realized using the so-called lateral trench detector (LTD). The main drawback of the LTD is the high capacitance of parallel trench electrodes, resulting in lower BW. The capacitance is proportional to the length and height of the fingers.

It would be advantageous if a photodetector could be fabricated with a reduced capacitance, to increase the signal bandwidth at long wavelengths of light, without seriously degrading the QE.

SUMMARY

Accordingly, a method is provided for fabricating a photodetector with a bandwidth-tuned cell structure. A semiconductor substrate is provided that is heavily doped with a first dopant. A plurality of adjoining cavities is formed in the semiconductor substrate having shared cell walls. A semiconductor well is formed in each cavity, moderately doped with a second dopant opposite in polarity to the first dopant. A layer of oxide is grown overlying the semiconductor wells and an annealing process is performed. Then, metal pillars are formed that extend into each semiconductor well having a central axis aligned with an optical path. A first electrode is connected to the metal pillar of each cell, and a second electrode connected to the semiconductor substrate. The capacitance between the first and second electrodes decreases in response to forming an increased number of semiconductor wells with a reduced diameter, and forming metal pillars with a reduced diameter.

In one aspect, the photodetector operates at a wavelength in a range of about 815 to 875 nanometers (nm), and the semiconductor well is silicon. Then, the metal pillars are formed by creating openings in each semiconductor well having an aspect ratio (L/d) of at least 7:1, where L is defined as a depth of the opening and d is defined as the opening diameter at a top surface of the cell well. Metal is deposited in each opening to form pillars. In another aspect, each opening has a ratio d/d0 of less than 10:1, where d0 is defined as the opening diameter at a bottom surface of the cell well.

Additional details of the above-described method and a photodetector with a bandwidth-tuned cell structure are provided below.

BRIEF DESCRIPTION OF THE DRAWINGS

FIGS. 5A and 5B are, respectively, plan and partial cross-sectional views of a photodetector with a bandwidth-tuned cell structure.

FIGS. 7A1 through 7A10 depict steps in alternative processes for fabricating a cell structure photodetector.

FIG. 8 is a partial cross-sectional view of a single cell from the 19-cell design of FIG. 7A10 contrasting normal etched cell walls with conic etched cell walls.

FIG. 10 is a graph depicting the parameter of bandwidth vs. W (microns) for various etch dimensions, cross-referenced to cell design.

FIG. 18 is a flowchart illustrating a method for using a photodetector with a bandwidth-tuned cell structure to measure optical signals.

DETAILED DESCRIPTION OF ILLUSTRATIVE EMBODIMENT

Figure 3A:
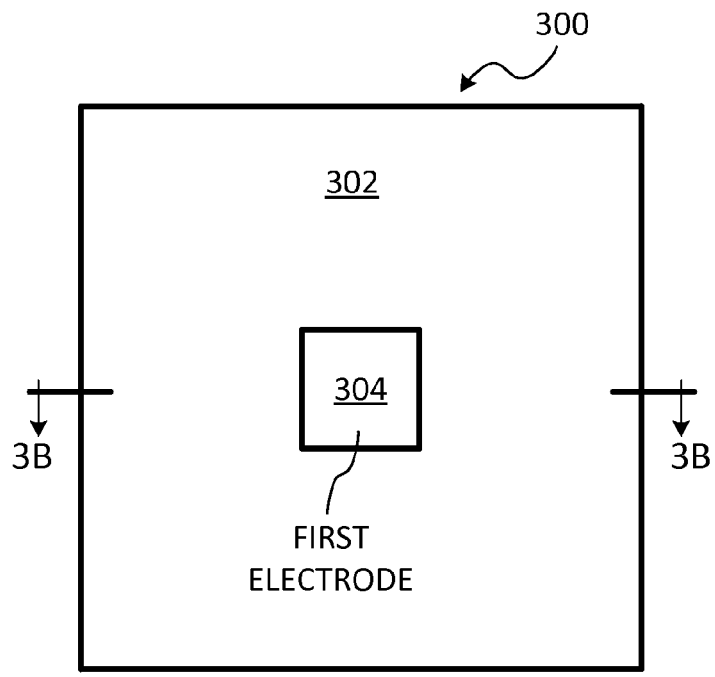
FIGS. 3A and 3B are, respectively, plan and partial cross-sectional views of a photodiode with an optical path-aligned electrode.
Figure 3B:
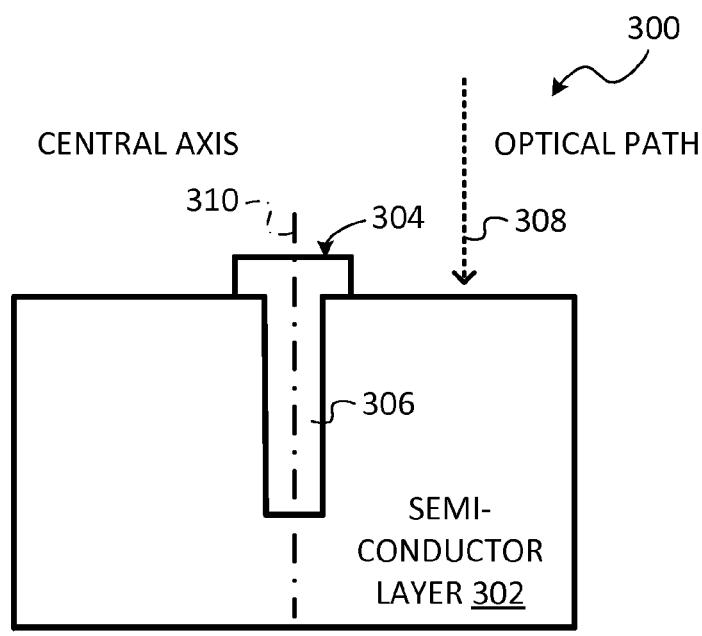

FIGS. 3A and 3B are, respectively, plan and partial cross-sectional views of a photodiode with an optical path-aligned electrode. The photodiode 300 is referred to as a vertical pillar photodiode (VPD). The photodiode 300 comprises a semiconductor layer 302 and a first electrode 304. The first electrode 304 is a vertical plane structure including at least one pillar 306 extending into the semiconductor layer 302, where the vertical plane is aligned with an optical path 308 and where a central axis 310 of the pillar is aligned with vertical plane. Second electrode configurations are presented below, with variations in the first electrode structure. As is true for all the other variations presented below, the semiconductor layer 302 may be silicon (Si), for example, epitaxially grown Si (epi-Si), Ge, Ge—Si compounds, GaAs, InGaAs, and other III-V Group compounds. However, the photodiode is not limited to any particular type of semiconductor material. The first electrode pillar 306 is typically a metal, but may alternatively be a doped semiconductor in some aspects.

Figure 4A:
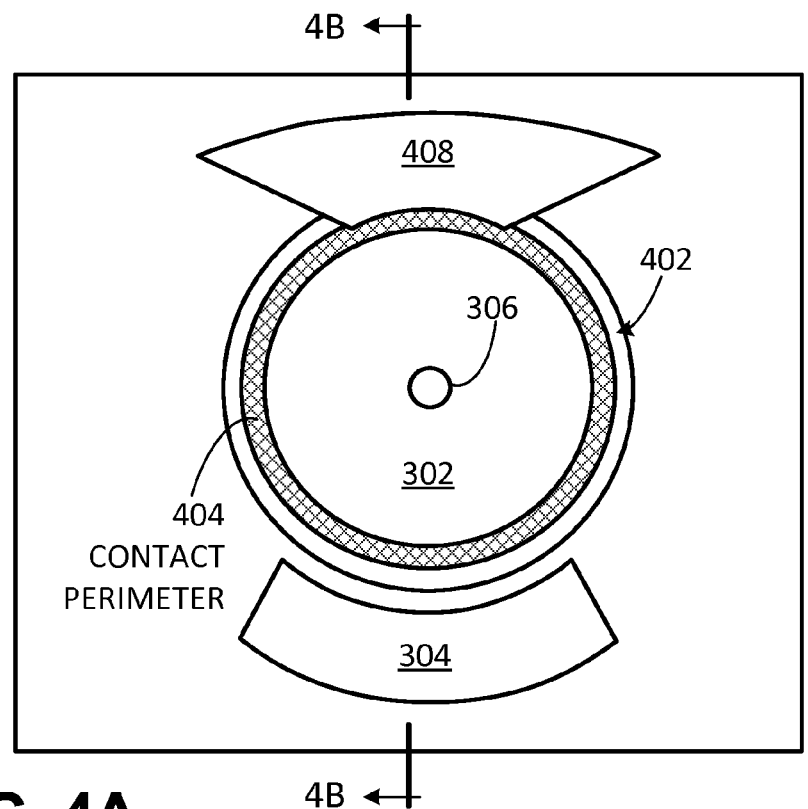
FIGS. 4A and 4B are, respectively, plan and cross-sectional views depicting a cell structure photodiode with an optical path-aligned electrode.
Figure 4B:
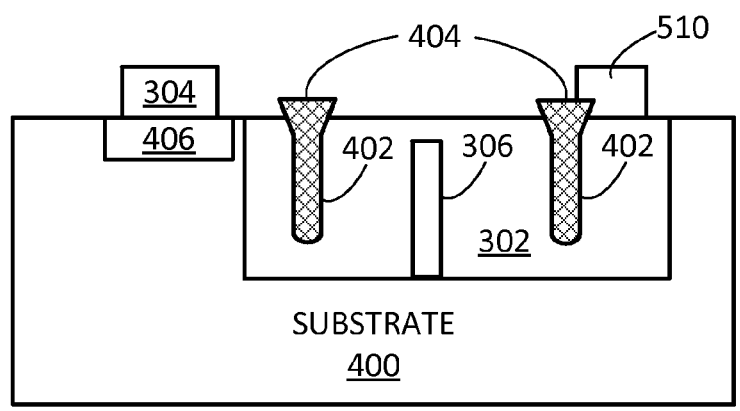

FIGS. 4A and 4B are, respectively, plan and cross-sectional views depicting a cell structure photodiode with an optical path-aligned electrode. In this aspect, the first electrode 304 further comprises a doped semiconductor substrate 400 underlying the semiconductor layer 302. The semiconductor layer 302 is formed in a well in the semiconductor substrate 1300. The second electrode is a vertical plane structure wall 402 surrounding the first electrode pillar 306. The second electrode further comprises an electrically conductive contact perimeter 404 overlying and in contact with the wall 402. A first electrical contact region 406 overlies the top surface of a doped semiconductor substrate 400. A second electrical contact region 408 overlies the semiconductor layer 302 top surface and is connected to the second electrode contact perimeter 404.

FIGS. 5A and 5B are, respectively, plan and partial cross-sectional views of a photodetector with a bandwidth-tuned cell structure. The photodetector 500 comprises a semiconductor substrate 502 heavily doped with a first dopant. A plurality of adjoining photodiode cells 504 are formed in a bandwidth-tuned honeycomb structure. Each photodiode cell 504 comprises a semiconductor substrate cavity 506 having shared walls 508 with adjacent cells 504. Each cell 504 has from 1 to 6 cell walls. As shown, each cell is a 6-sided hexagonal. FIG. 4A depicts a 1-sided wall shown as a circle, but that alternatively the single wall may be an oval. Although not expressly shown, 2-sided cells may be an eye-shape, 3-sided cells might be formed as triangles, and 4-sided cells as squares or rectangles, etc. Cells with more than 6 walls are possible.

A semiconductor well 510 is formed in the semiconductor substrate cavity 506, moderately doped with a second dopant opposite in polarity to the first dopant. A metal pillar 512 extends into the semiconductor well 510, having a central axis 514 aligned with (parallel to) the optical path 516. A first electrode is connected to the metal pillar 512 of each cell 504. A second electrode is connected to the semiconductor substrate 502. For clarity, the first and second electrodes are not shown, see FIG. 7A9.

As explained in greater detail below, the capacitance between the first electrode and second electrode decreases in response to increasing the number of cells 504, while decreasing the diameter 522 of each cell well 510, and decreasing the diameter 524 of each metal pillar 512. Alternately stated, the photodetector 500, under bias conditions, provides a higher bandwidth response to an optical input signal in response to increasing the number of cells 504, decreasing the diameter 522 of each cell well 510, and decreasing the diameter 524 of each metal pillar 512. In another aspect the photodetector 500, under bias conditions, provides a higher quantum efficiency (QE) response to an optical input signal in response to decreasing the number of cells 504, increasing the diameter 522 of each cell well 510, and increasing the diameter 524 of each metal pillar 512.

Figure 6:
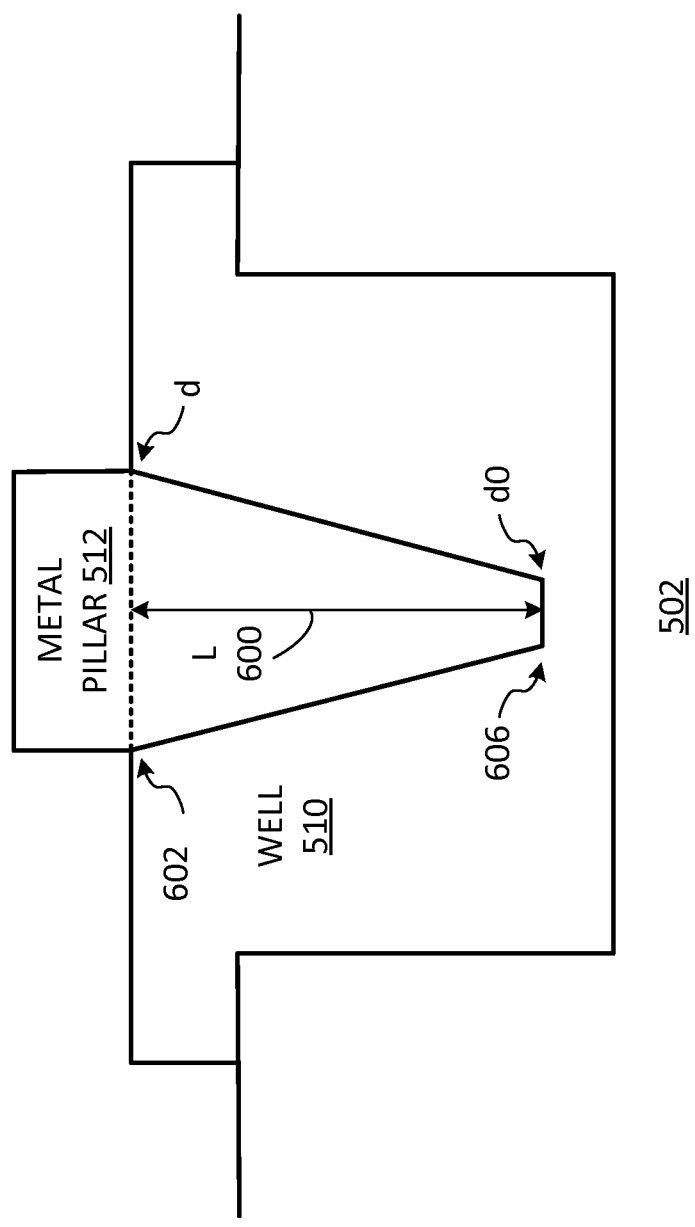
FIG. 6 is a partial cross-sectional view of a variation of the photodetector of FIG. 5B, depicting one cell in detail.

FIG. 6 is a partial cross-sectional view of a variation of the photodetector of FIG. 5B, depicting one cell in detail. In this aspect, the photodetector 500 operates at a wavelength in the range of about 815 to 875 nanometers (nm), and the semiconductor well 510 is silicon. Each metal pillar 512 has an aspect ratio (L/d) of at least 7:1, where L 600 is defined as a length of the metal pillar 512 from the cell well top surface 604, and d 602 is defined as the metal pillar diameter at the top surface 604 of the cell well 510. Each metal pillar 512 has a ratio d/d0 of less than 10:1, where d0 606 is defined as a metal pillar diameter at a bottom surface 608 of the cell well 510.

The VPD design concept, which forms the basis of the bandwidth-tuned cell structure design, has an inherently lower capacitance of parallel wire conductors, in comparison to parallel plate conductors. In another aspect, the design is based upon the lower capacitance of coaxial conductors, as contrasted to parallel plate conductors of the same length and with the same distance between conductors. Their vertical orientation makes the pillars normal to the active layer orientation and parallel to the direction of incident light. As described above, the interfinger structure might be formed as a plurality of cells where a central pillar of one polarity is surrounded by peripheral pillars of opposite polarity arranged in hexagonal symmetry.

In another aspect, the VPD design may be realized as a plurality of vertical approximately coaxial conductors built-in into a semiconductor active layer. A central conducting pillar forms an inner electrode and a surrounding conductive wall forms the outer electrode of a single cell. The outer electrodes of neighboring cells may merge to form continuous wall structure over the whole active area of VPD, for example, in a honeycomb structure.

Figure 2:
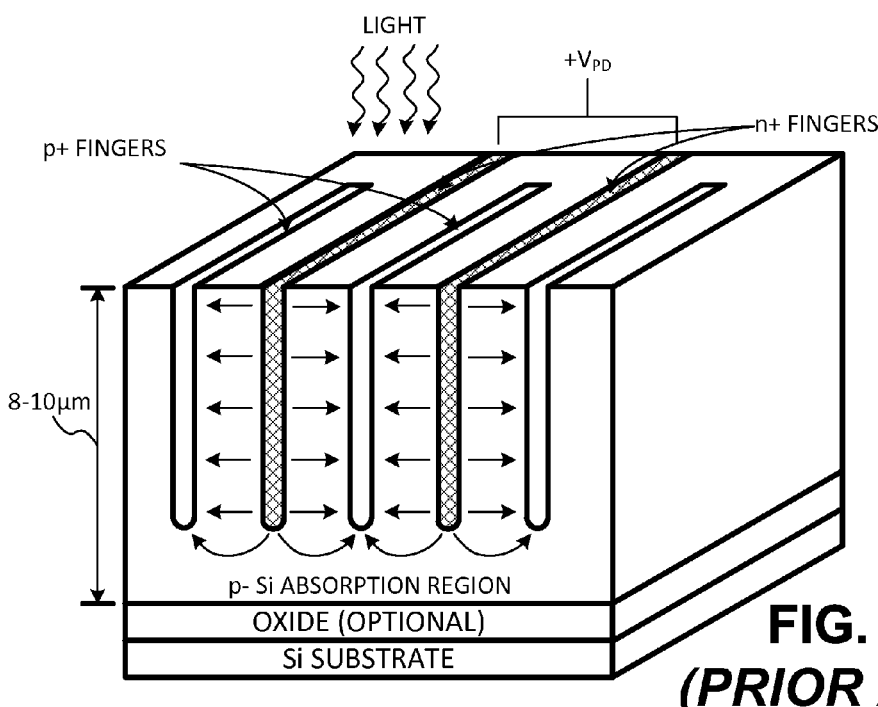
FIG. 2 is a partial cross-sectional view of lateral trench detector (prior art).

The VPD design concept provides approximately the same QE at the same active layer thickness with considerable lower capacitance, in comparison with a LTD design (see FIG. 2). The capacitances of VPD and LTD can be compared, as expressed per active illuminated area [F/cm²]. As the upper margin estimate of VPD capacitance, the following expression may be applied for coaxial conductors:

$$Cltd(W, L, d, \varepsilon) := \frac{\varepsilon \cdot L \cdot D}{W} \cdot \frac{1}{(W+d) \cdot D} \quad (1)$$

$$\text{Cvpd\_coax}(W, L, d, \varepsilon) := \frac{2 \cdot \pi \cdot \varepsilon \cdot L}{\ln\left(1 + 2\frac{W}{d}\right)} \cdot \frac{1}{\pi(W + d)^2} \quad (2)$$

Where W is the distance between trenches for the LTD structure, and the distance between a central pillar and peripheral walls for VPD. Where D is the trench length (about equal to the length of the active area), d is width of trenches for LTD, and diameter of central pillar and thickness of peripheral wall (assuming the wall thickness is the same as the central pillar) for VPD. Where L is height or depth of trenches and pillars/walls, and ε is dielectric constant of semiconductor. Both expressions are a product of elementary cell capacitance [F] to the density of elementary cells [cm$^{-2}$] (inversely equal to elementary cell area):

$$\frac{\text{Cltd}(W, L, d, \varepsilon)}{\text{Cvpd\_coax}(W, L, d, \varepsilon)} = \frac{1}{2} \cdot \ln\left(1 + \frac{2 \cdot W}{d}\right) \cdot \left(1 + \frac{d}{W}\right) \quad (3)$$

The ratio of equation (3) is more than 1 for any W/d, and it increases with the increase of W/d. For example, it is equal to 2 at W/d~10, which is reasonable practical value in an example where W~3.5 um and d~0.4 um for conventional LTD samples.

Figure 1:
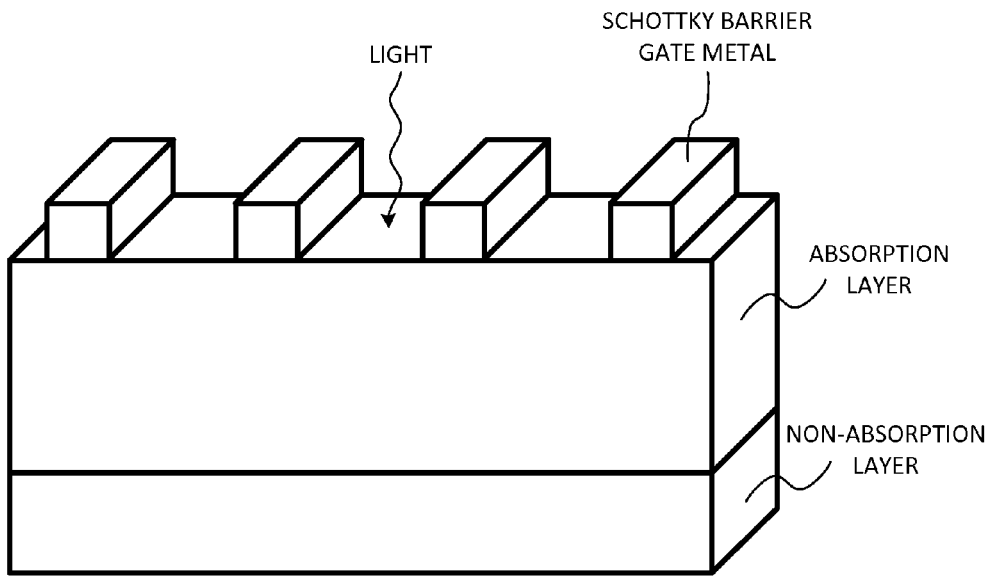
FIG. 1 is a diagram depicting a metal-semiconductor-metal (MSM) photodetector (prior art).
Figure 10:
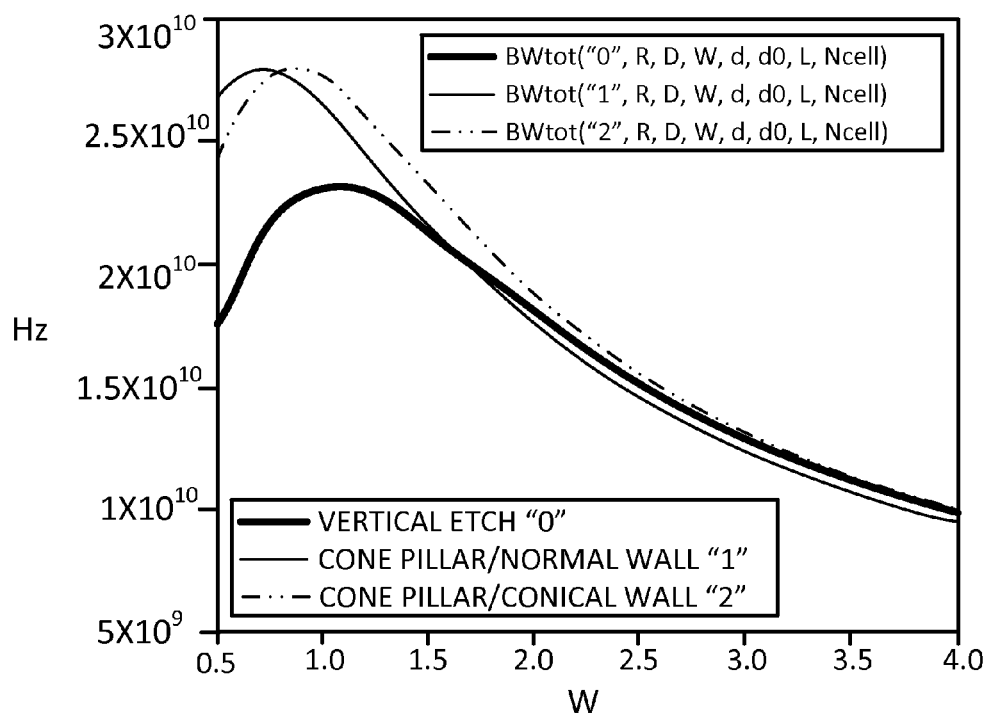

FIGS. 7A1 through 7A10 depict steps in alternative processes for fabricating a cell structure photodetector. Each figure shows plan and cross-sectional views. In FIG. 7A1 both processes begin with a heavily doped substrate. In this example, the substrate 502 is an n++ Si (heavily n-doped) wafer with a conductivity of less than or equal to 0.01 ohm-cm. Note: an equivalent design may be enabled using a p++ (heavily p-doped) substrate and reversing the doping polarities described below. In FIG. 7A2 both processes photoresist mask a honeycomb cell pattern. In this example the 3 cells cover an area of about 25 microns, but structures of greater than 40 cells are possible.

In FIG. 7A3 both processes anisotropically etch to form cavities 506 for epitaxy. In this example, the cavities have a depth of about 10 microns (μm). In FIG. 7A4 both processes form epitaxy (epi) in the cavities to create semiconductor wells 510. In this example the epitaxy is p-doped Si with a conductivity of greater than or equal to 10 ohm-cm. A chemical-mechanical polish (CMP) process follows.

In FIG. 7A5 a thin layer of oxide growth 700 is followed by a thick oxide layer 702. The oxide 700/702 is planarized and then annealed. In FIG. 7B5 the substrate is conformally coated with photoresist 704 except for the center of the wells 510, which is anisotropically etched. In this example, the openings 706 have a diameter of about 140 microns at the level of the photoresist.

In FIG. 7A6 the substrate is conformally (completely) coated with photoresist 708 except for the center of the wells 510, which is anisotropically etched. For example, a reactive ion etching process may be used to form openings 710. In FIG. 7B6 metal 712 is deposited in the previously formed openings to form a pillar. For example, the metal may be Al. An ohmic contact is formed with the p-Si epi.

In FIG. 7A7 metal 714 is deposited in the previously formed openings to form a pillar. An ohmic contact is formed with the p-Si epi. In FIG. 7B7 the n++ substrate 502 is covered with a thick insulator 716 such as oxide. A p+ Si layer 718 is formed at the top surface of the well 510. For example, the n-Si in the well 510 may be implanted with p dopants.

In FIG. 7A8 a metal is deposited to contact pillars 512, forming an electrode 720. For example, the metal may have a width in the range of 130 to 140 nanometers (nm). Plan view a) is associated with the cross-section view, while plan view b) is a variation, both with the goal of minimizing light blockage. In FIG. 7B8 a metal 722 (e.g., Al) is deposited on the p-Si layer 718 to form an electrode.

Figure 9:
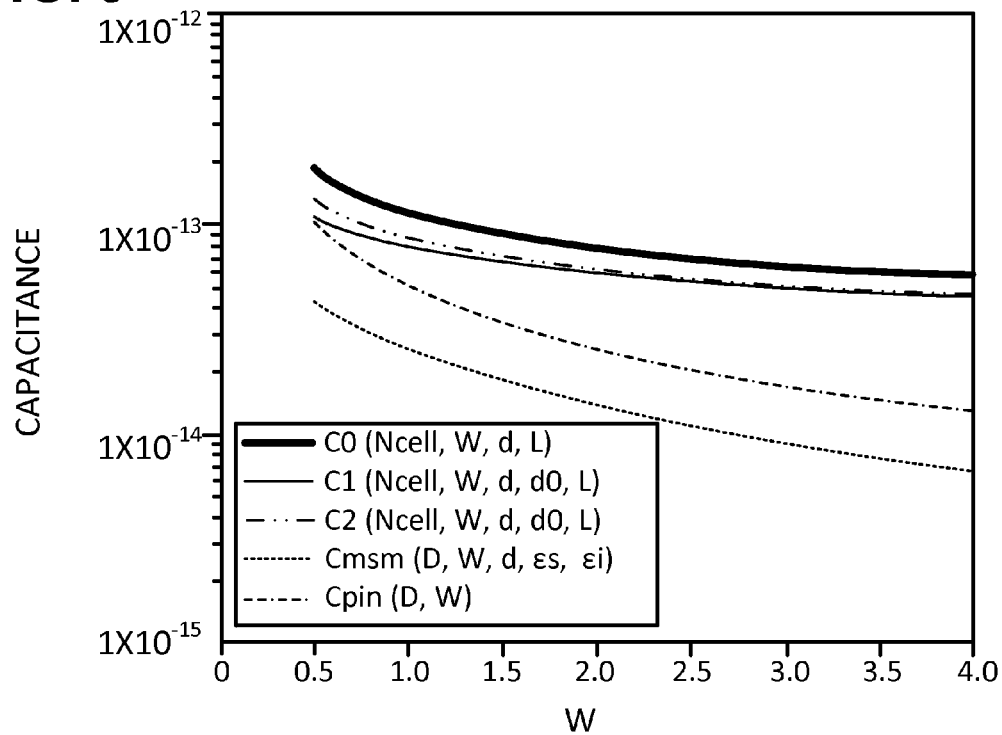
FIG. 9 is a graph depicting the parameter of capacitance vs. various etch dimensions of W (microns), cross-referenced to cell design.

In FIGS. 7A9 and 7B9 metal 724 is deposited on the n++ substrate 502 to form the other electrode. The cross-section view of FIG. 7A9 continues the variation of FIG. 7A8a. The plan view of FIG. 7A9 continues the variation of FIG. 7A8b.

FIG. 7A10 depicts to plan view of FIG. 7A9 extended to a 19-cell design.

FIG. 8 is a partial cross-sectional view of a single cell from the 19-cell design of FIG. 7A10 contrasting normal etched cell walls with conic etched cell walls. The cell is design to operate at 25 gigahertz (GHz) with a pillar upper diameter (d) of 20 microns. The cell etching process may be used to create a pillar with a lower diameter d0 that is less than d, which advantageously minimizes optical response delay associated with photons collected in the lower portion of the cell. "W" is the space between the semiconductor etched wall and the metal pillar.

FIG. 9 is a graph depicting the parameter of capacitance vs. various etch dimensions of W (microns), cross-referenced to cell design. Cell C0 represents normally etched cell walls and a normal pillar shape (d=d0). C1 represents normally etched wall with a conical pillar, and C2 represents conically etched walls with conical pillar. $C_{MSM}$ and $C_{PIN}$ represent, respectively, equivalent metal-semiconductor-metal (MSM) and PIN diode designs. $N_{CELL}$ is the number of cells, ∈s is the dielectric constant of the semiconductor material, and ∈i is the dielectric constant of the passivation layer.

FIG. 10 is a graph depicting the parameter of bandwidth vs. W (microns) for various etch dimensions, cross-referenced to cell design. The "vertical etch" trace represents a cell with normal walls and normal pillar (d=d0), where D is the diameter of the entire structure (aggregating all the cells in the system) and R is the resistivity of the pillar material.

Figure 11:
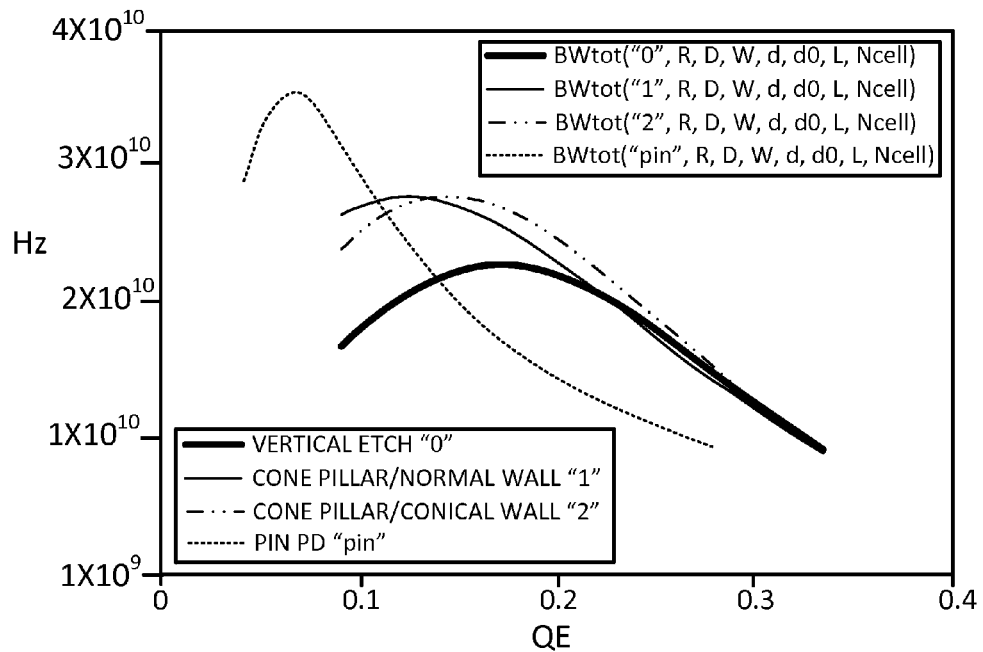
FIG. 11 is a graph depicting the parameter of bandwidth vs. quantum efficiency (QE), cross-referenced to cell design.

FIG. 11 is a graph depicting the parameter of bandwidth vs. quantum efficiency (QE), cross-referenced to cell design.

Figure 12:
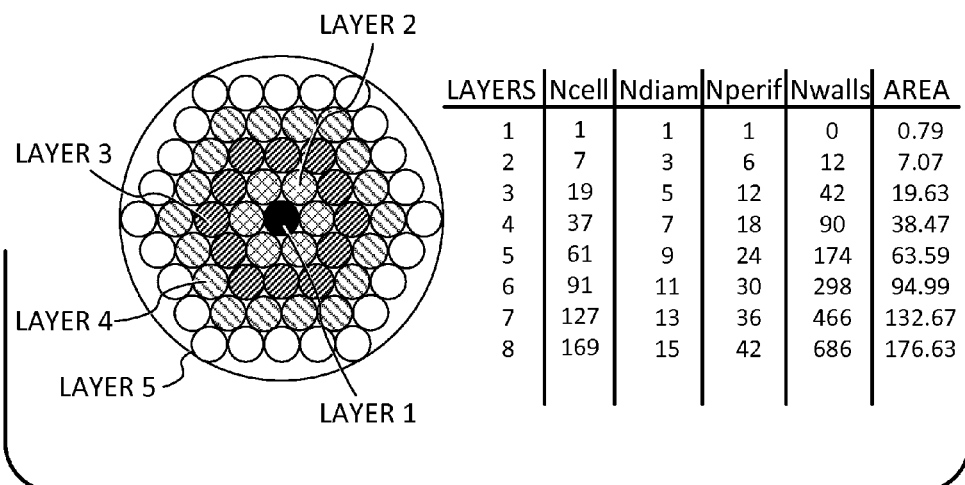
FIG. 12 is a plan view of a 61-cell 5-layer photodetector.

FIG. 12 is a plan view of a 61-cell 5-layer photodetector. The accompanying chart describes parameters associated with 1 through 8-layer photodetectors. The parameters include cell diameter (Ndiam), number of cells of the periphery (Nperif), the total number of walls (Nwalls), and the cell surface area. Here, the layers are shown as concentric circles.

In one aspect, the photodetector comprises a plurality of selectively engagable layers, where each layer includes at least on photodiode cell. For example, in the depicted 5-layer design the first layer (e.g., the center cell) may be selectively engaged (biased) while the second layer (surrounding the center cell) is not enabled. In this manner, the photodetector may "focused" with layer combinations, power usage minimized, or bandwidth characteristics modified. Alternatively, the layers need not be organized as concentric circles. For example, a 2-layer design may comprise top half (semi-circle) and bottom half (semi-circle) cell layers. A 4-layer design may comprise layers organized as quadrants, and a multi-layer design may comprise pie-shaped cell sections. Other layering shapes are also possible.

Figure 13:
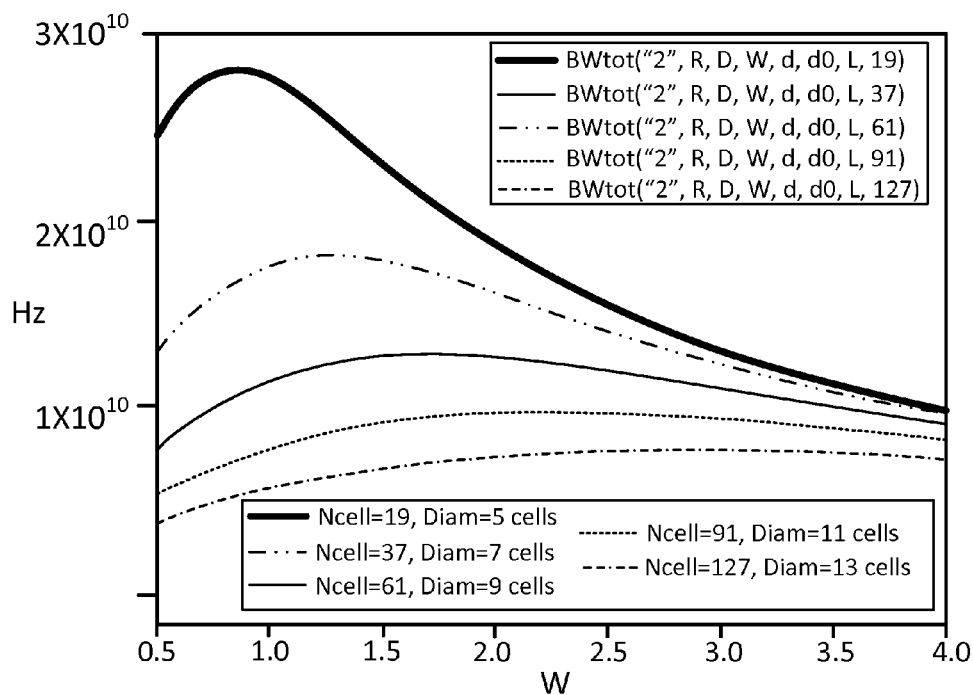
FIG. 13 is a graph depicting the parameter of bandwidth vs. W, cross-referenced to the number of cells (Ncell).

FIG. 13 is a graph depicting the parameter of bandwidth vs. W, cross-referenced to the number of cells (Ncell). For all variations d=1 micron, dw=1 micron, the strip width of the overlying metal electrode connection is 1 micron, and L=10 microns.

Figure 14:
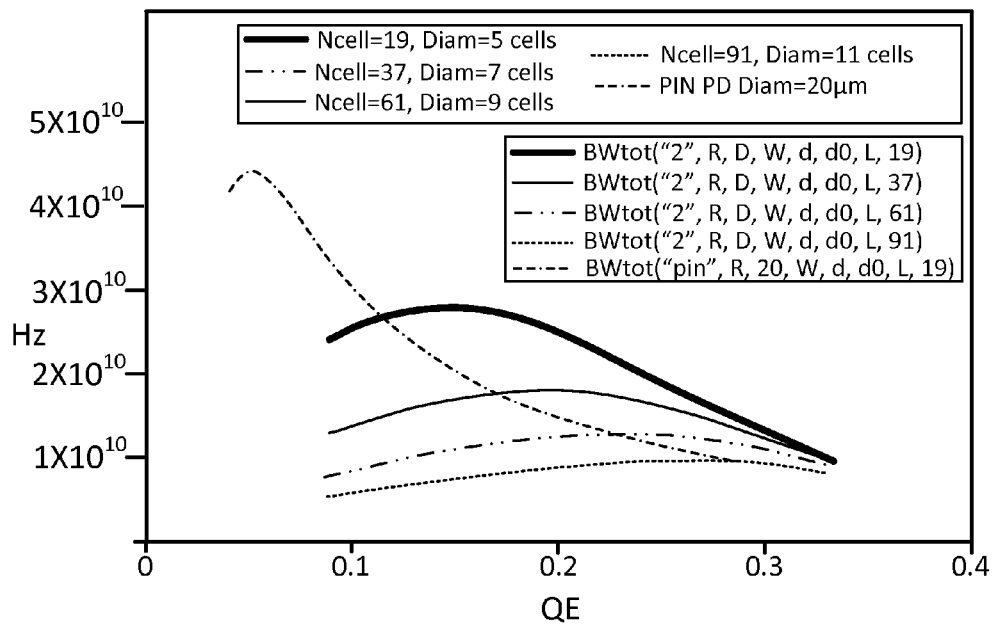
FIG. 14 is a graph depicting the parameter of bandwidth vs. QE, cross-referenced to the number of cells.

FIG. 14 is a graph depicting the parameter of bandwidth vs. QE, cross-referenced to the number of cells.

Figures 15, 16:
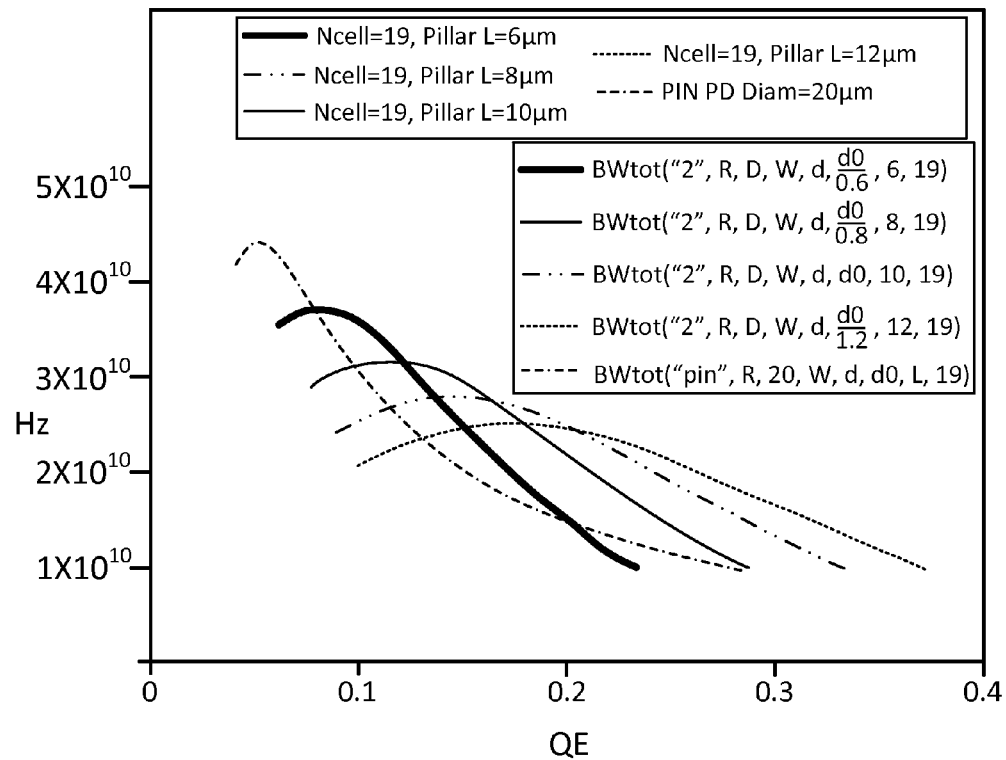
FIG. 15 is a graph depicting the parameter of bandwidth vs. QE, cross-referenced to variations in pillar length (L).
FIG. 16 is a table describing the relationship between the number of cell layers, W, bandwidth, QE, and cell area.

FIG. 15 is a graph depicting the parameter of bandwidth vs. QE, cross-referenced to variations in pillar length (L). The number of cells for all variations is 19. The PIN photodiode (PD) has a diameter of 20 microns.

FIG. 16 is a table describing the relationship between the number of cell layers, W, bandwidth, QE, and cell area. For example, a 19-cell design (3 layers) has a QE of 27% at a bandwidth of 20 GHz using a pillar length (L) of 12 microns. These calculations do not include the effects of stray capacitance and resistance.

Figure 17:
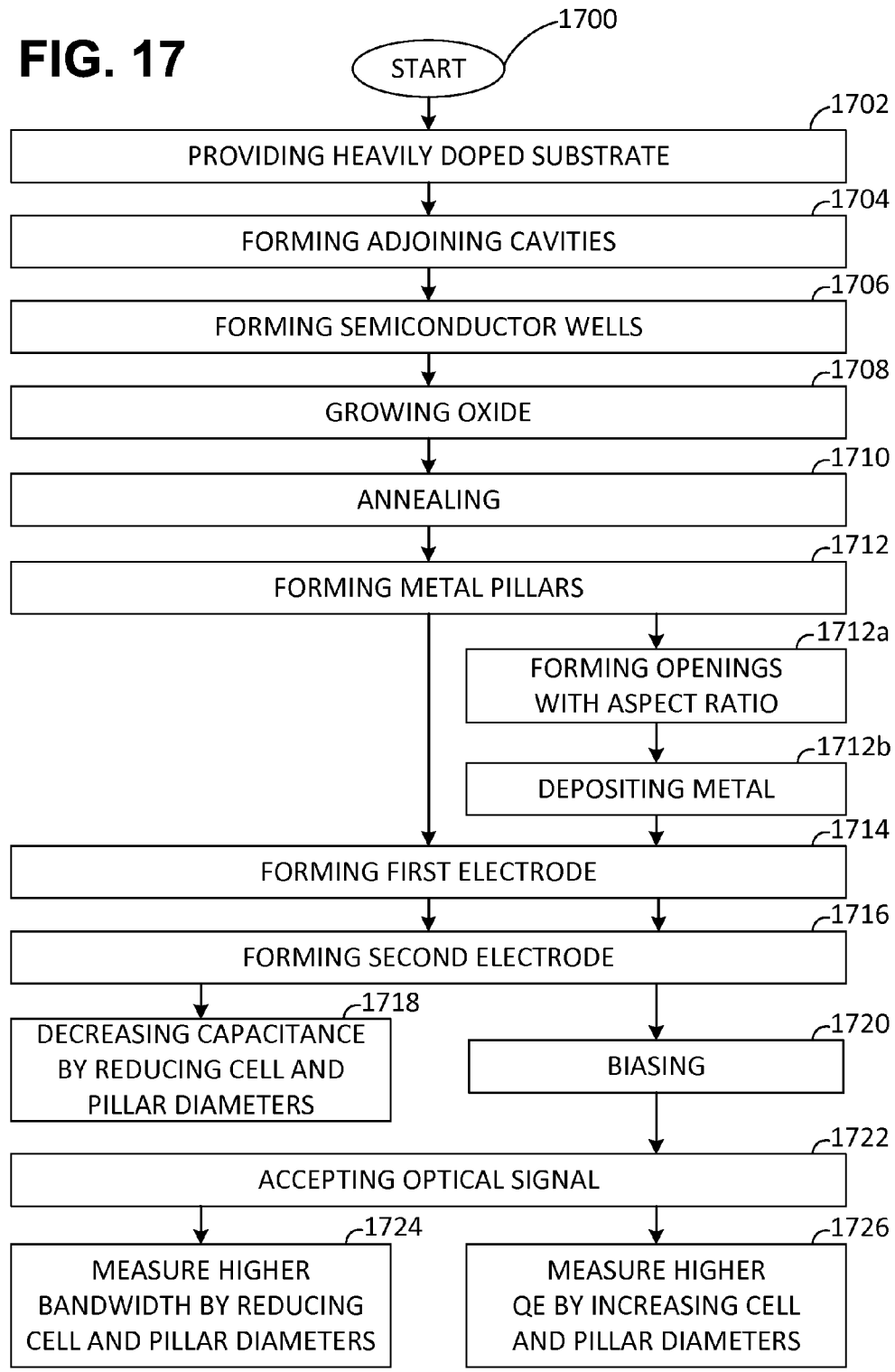
FIG. 17 is a flowchart illustrating a method for fabricating a photodetector with a bandwidth-tuned cell structure.

FIG. 17 is a flowchart illustrating a method for fabricating a photodetector with a bandwidth-tuned cell structure. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the method follows the numeric order of the depicted steps. The method starts at Step 1700.

Step 1702 provides a semiconductor substrate heavily doped with a first dopant. Step 1704 forms a plurality of adjoining cavities in the semiconductor substrate having shared cell walls. The cavities may have any number of cell walls, although a number from 1 to 6 is typical, where a 1-sided wall is defined by an oval or circular shape. Step 1706 forms a semiconductor well in each cavity, moderately doped with a second dopant opposite in polarity to the first dopant. Step 1708 grows a layer of oxide overlying the semiconductor wells. Step 1710 anneals the semiconductor wells. Step 1712 forms a metal pillar extending into each semiconductor well having a central axis aligned with an optical path. Step 1714 forms a first electrode connected to the metal pillar of each cell. Step 1716 forms a second electrode connected to the semiconductor substrate.

In one aspect, Step 1718 decreases capacitance between the first and second electrodes in response to forming an increased number of semiconductor wells with a reduced diameter, and forming metal pillars with a reduced diameter. In another aspect, Step 1720 provides a bias voltage to the first and second electrodes. Step 1722 accepts an optical signal. Step 1724 measures a higher bandwidth in response to forming an increased number of semiconductor wells with a reduced diameter, and forming metal pillars with a reduced diameter. Alternatively, Step 1726 measures a higher quantum efficiency (QE) in response to forming a decreased number of semiconductor wells with an increased diameter, and forming metal pillars with an increases diameter.

In another aspect, Step 1722 supplies an optical signal at a wavelength in a range of about 815 to 875 nanometers (nm), and Step 1706 forms semiconductor wells of silicon. Then, forming the metal pillars in Step 1712 includes substeps. Step 1712a forms an opening in each semiconductor well having an aspect ratio (L/d) of at least 7:1, where L is defined as a depth of the opening and d is defined as the opening diameter at a top surface of the cell well. Step 1712b deposits metal in the opening. In one aspect, Step 1712a forms openings having a ratio d/d0 of less than 10:1, where d0 is defined as the opening diameter at a bottom surface of the cell well.

FIG. 18 is a flowchart illustrating a method for using a photodetector with a bandwidth-tuned cell structure to measure optical signals. The method starts at Step 1800. Step 1802 provides a photodetector with a plurality of adjoining photodiode cells formed in a bandwidth-tuned honeycomb structure, where each cell comprises a metal pillar extending into a semiconductor well, having a central axis aligned with an optical path. Step 1804 accepts a bias voltage between first and second electrodes of the photodetector. Step 1806 accepts an optical signal. Step 1808 measures a higher bandwidth response to forming an increased number of semiconductor wells with a reduced diameter, and forming metal pillars with a reduced diameter. In one aspect, Step 1810 measures a higher quantum efficiency (QE) in response to forming a decreased number of semiconductor wells with an increased diameter, and forming metal pillars with an increases diameter.

In another aspect, Step 1802 provides a photodetector having silicon semiconductor walls, metal pillars having an aspect ratio (L/d) of at least 7:1, where L is defined as a length of the metal pillar and d is defined as a metal pillar diameter at a top surface of the cell well. The metal pillars have a ratio d/d0 of less than 10:1, where d0 is defined as a metal pillar diameter at a bottom surface of the cell well. Step 1806 accepts an optical signal having a wavelength in a range of about 815 to 875 nm.

A photodetector has been presented with a bandwidth-tuned cell structure. Examples of particular topologies, geometries, materials, and process steps have been presented to illustrate the invention. However, the invention is not limited to merely these examples. Other variations and embodiments of the invention will occur to those skilled in the art.

What is claimed:

1. A method for fabricating a photodetector with a bandwidth-tuned cell structure, the method comprising:
   providing a semiconductor substrate heavily doped with a first dopant;
   forming a plurality of adjoining cavities in the semiconductor substrate having shared cell walls;
   forming a semiconductor well in each cavity, moderately doped with a second dopant opposite in polarity to the first dopant;
   growing a layer of oxide overlying the semiconductor wells;
   annealing the semiconductor wells;
   forming a metal pillar extending into each semiconductor well having a central axis aligned with an optical path;
   forming a first electrode connected to the metal pillar of each cell; and,
   forming a second electrode connected to the semiconductor substrate.

2. The method of claim 1 further comprising:
   decreasing a capacitance between the first and second electrodes in response to forming an increased number of semiconductor wells with a reduced diameter, and forming metal pillars with a reduced diameter.

3. The method of claim 1 further comprising:
   providing a bias voltage to the first and second electrodes;
   accepting an optical signal;
   measuring a higher bandwidth response to forming an increased number of semiconductor wells with a reduced diameter, and forming metal pillars with a reduced diameter.

4. The method of claim 1 further comprising:
   providing a bias voltage to the first and second electrodes;
   accepting an optical signal;
   measuring a higher quantum efficiency (QE) in response to forming a decreased number of semiconductor wells with an increased diameter, and forming metal pillars with an increased diameter.

5. The method of claim 1 further comprising:
   providing a bias voltage to the first and second electrodes;

accepting an optical signal at a wavelength in a range of about 815 to 875 nanometers (nm);
wherein forming the semiconductor well in each cavity includes forming silicon wells;
wherein forming the metal pillars includes:
   forming an opening in each semiconductor well having an aspect ratio (L/d) of at least 7:1, where L is defined as a depth of the opening and d is defined as the opening diameter at a top surface of the cell well; and,
   depositing metal in the opening.

6. The method of claim 5 wherein forming the opening in each semiconductor well includes each opening having a ratio d/d0 of less than 10:1, where d0 is defined as the opening diameter at a bottom surface of the cell well.

7. The method of claim 1 wherein forming the plurality of adjoining cavities includes forming cavities with a number of cell walls selected from a group consisting of 1 through 6, where a 1-sided wall is defined by a shape selected from a group consisting of oval and circular.

* * * * *